US012028078B2

(12) United States Patent
Sinha et al.

(10) Patent No.: US 12,028,078 B2
(45) Date of Patent: Jul. 2, 2024

(54) LOAD DEPENDENT DISCHARGE FOR VOLTAGE CONTROLLED OSCILLATOR-BASED CHARGE PUMP REGULATOR

(71) Applicant: TEXAS INSTRUMENTS INCORPORATED, Dallas, TX (US)

(72) Inventors: Rohan Sinha, Bengaluru (IN); Anand Kamra, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/823,567

(22) Filed: Aug. 31, 2022

(65) Prior Publication Data

US 2024/0072783 A1    Feb. 29, 2024

(51) Int. Cl.
*H03K 5/24* (2006.01)
*H02M 3/07* (2006.01)
*H03K 3/037* (2006.01)

(52) U.S. Cl.
CPC ............ *H03K 5/2481* (2013.01); *H02M 3/07* (2013.01); *H03K 3/0375* (2013.01)

(58) Field of Classification Search
CPC ...... H03K 5/2481; H03K 3/0375; H02M 3/07
See application file for complete search history.

(56) References Cited

U.S. PATENT DOCUMENTS

| 7,375,595 | B2 | 5/2008 | Serrano | |
| 2010/0156518 | A1* | 6/2010 | Hoque | G05F 1/56 |
| | | | | 327/538 |
| 2010/0259235 | A1* | 10/2010 | Ozalevli | G05F 1/56 |
| | | | | 323/274 |
| 2011/0170714 | A1* | 7/2011 | Hanzlik | H04R 19/005 |
| | | | | 381/111 |
| 2012/0001604 | A1 | 1/2012 | Lee | |
| 2015/0212530 | A1* | 7/2015 | Forejtek | G05F 1/575 |
| | | | | 323/280 |
| 2019/0207520 | A1* | 7/2019 | Imade | H05B 45/395 |
| 2020/0195160 | A1 | 6/2020 | Mayell | |
| 2022/0149729 | A1 | 5/2022 | Mei | |
| 2022/0352818 | A1* | 11/2022 | D'Souza | H04B 1/0057 |

FOREIGN PATENT DOCUMENTS

KR    20140088783 A    7/2014

OTHER PUBLICATIONS

PCT Search Report dated Dec. 15, 2023.

* cited by examiner

*Primary Examiner* — Sibin Chen
(74) *Attorney, Agent, or Firm* — Charles F. Koch; Frank D. Cimino

(57) ABSTRACT

A pulse generator circuit includes a charge pump having a charge pump output. A voltage divider is coupled to the charge pump output. The voltage divider has a voltage divider output. An error amplifier has a first error amplifier input and a second error amplifier input. The first error amplifier input is coupled to the voltage divider output. A dependent current source circuit has a first input coupled to the charge pump output, a second input coupled to the voltage divider output, and a third input coupled to the second error amplifier input. The dependent current source is configured to cause a current to flow from the charge pump output that is proportional to a difference between a first voltage at the voltage divider output and a second voltage at the second error amplifier input.

16 Claims, 6 Drawing Sheets

LOAD DEPENDENT DISCHARGE FOR VOLTAGE CONTROLLED OSCILLATOR-BASED CHARGE PUMP REGULATOR

BACKGROUND

An electrically erasable programmable read only memory (EEPROM) is a non-volatile memory device whose contents can be electrically erased and reprogrammed. Like most integrated circuits (ICs), an EEPROM operates from a supply voltage (VDD). However, EEPROMs generally require voltages substantially higher than VDD for the erase and program cycles. A pulse generator may be used to provide such elevated voltages to erase and program an EEPROM.

SUMMARY

A pulse generator circuit includes a charge pump having a charge pump output. A voltage divider is coupled to the charge pump output. The voltage divider has a voltage divider output. An error amplifier has a first error amplifier input and a second error amplifier input. The first error amplifier input is coupled to the voltage divider output. A dependent current source circuit has a first input coupled to the charge pump output, a second input coupled to the voltage divider output, and a third input coupled to the second error amplifier input. The dependent current source is configured to cause a current to flow from the charge pump output that is proportional to a difference between a first voltage at the voltage divider output and a second voltage at the second error amplifier input.

DETAILED DESCRIPTION

Figure 1:
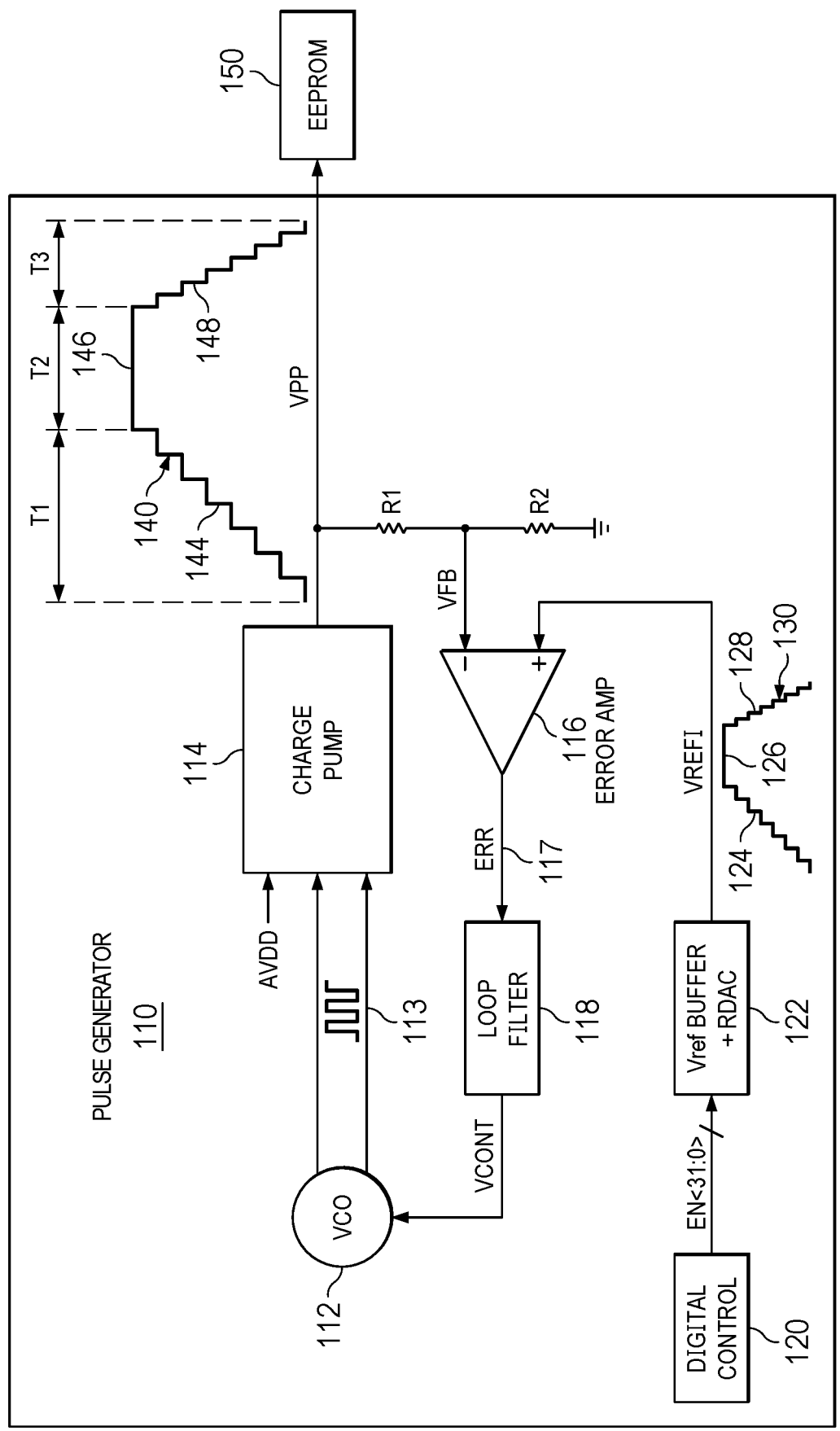
FIG. 1 is a block diagram of a pulse generator for providing a voltage pulse to a memory device, in an example.

The same reference numbers or other reference designators are used in the drawings to designate the same or similar (either by function and/or structure) features.

FIG. 1 is a schematic of pulse generator 110 coupled to an EEPROM 150. The pulse generator 110 provides a high voltage pulse, VPP, to the EEPROM during a programming cycle of the EEPROM. The pulse generator 110, or other circuitry, may provide one or more other voltages as well to the EEPROM. The embodiments described herein are directed to the control of the discharge phase of the VPP voltage pulse during a programming phase of the memory device. The principles described herein may be applicable to other voltage pulses applied to the EEPROM as well. Further, the principles described herein may apply to the discharge phase of a voltage pulse applied to memory devices other than EEPROMs.

The pulse generator 110 includes a voltage-controlled oscillator (VCO) 112, a charge pump 114 (or other type of voltage circuit which produces an output voltage larger than its input voltage), an error amplifier 116, a loop filter 118, a digital control circuit 120, buffer and resistive digital-to-analog converter (RDAC) 122, and resistors R1 and R2. The charge pump 114 provides a voltage VPP to the EEPROM 150. The resistors R1 and R2 are coupled in series between VPP and ground to form a voltage divider. The voltage at the connection between R1 and R2 is designated as VFB. VFB is a scaled-down version of VPP. For example, VFB is approximately equal to VPP*(R2/(R1+R2).

The error amplifier 116 has a positive (non-inverting, +) input and a negative (inverting, -) input. The negative input of the error amplifier 116 is coupled to resistor R2 and thus receives voltage VFB. The positive input of the error amplifier receives a reference voltage, VREFI, from the buffer and RDAC 122. The error amplifier 116 amplifies the difference between VREFI and VFB to produce an error signal (ERR). The error signal ERR is provided to an input of the loop filter 118. The loop filter 118 filters the error signal to produce a filtered output voltage, VCONT. VCONT is an input control voltage to the VCO 112.

The VCO 112 produces an output oscillation signal 113 whose frequency is a function of the magnitude of VCONT. As VCONT increases, the oscillation signal's frequency increases. Conversely, as VCONT decreases, the oscillation frequency decreases. The charge pump 114 receives the oscillation signal 113 and the supply voltage, AVDD, and produces an output voltage, VPP, which generally is a larger voltage than AVDD. The voltage magnitude of VPP is based, at least in part, on the frequency of the oscillation signal.

The digital control circuit 120 provides a digital value, EN that causes the buffer and RDAC 122 to generate VREFI. In one example, EN is a 32-bit value (EN<31:0>) for which only one bit among the 32 bits is "1" at any point in time. Responsive to EN<31>=1, the buffer and RDAC 122 produces a VREFI approximately equal to 1 V, and when EN<0>=1, the buffer and RDAC 122 produces a VREFI approximately equal to 0 V. VREFI ranges from approximately 0 V to approximately 1 V in 32 steps for the case in which EN is a 32-bit digital value.

In response to a time sequence of digital values of EN, the buffer and RDAC 122 produces an output pulse 130 which may ramp up from approximately 0 V to approximately 1 V in a stair-step fashion as indicated by reference numeral 124, then remain relatively flat as indicated by reference numeral 126, and then ramp down in a stair-step fashion as indicated by reference numeral 128. A control loop is formed by the error amplifier 116, loop filter 118, VCO 112, and charge pump 114 to control the magnitude of VPP to be larger than, but proportional to, VREFI. As VREFI increases, the control loop increases the magnitude of VPP in such a way to force VFB to be approximately equal to VREFI. Accordingly, the voltage pulse 130 of VREFI causes a similarly-shaped voltage pulse 140 of VPP (albeit at a larger magnitude). VPP's voltage pulse has a rising edge 144, a relatively flat portion 146, and a falling edge 148.

The EEPROM 150 as an input capacitance that is charged in accordance with the rising edge 144 of the VPP voltage pulse. The charge pump 114 increases the VPP voltage to form the rising edge 144, and then decreases the VPP voltage to form the falling edge. The slew rate of the falling edge 148 is limited by the speed at which the EEPROM's output capacitance can discharge, and the discharge rate is proportional to the magnitude of the current to the ground potential of the pulse generator and is inversely proportional the magnitude of the output capacitance.

The embodiments described herein are directed to controlling the discharge time of the EEPROM's input capacitance. FIG. 1 identifies the charge time of the VPP pulse 140 as T1 (to charge the EEPROM's input capacitance), the steady state time as T2, and the discharge time as T3. The shape of the programming pulse, VPP, may be different among different EEPROMs. For some EEPROMs, for example, the width of the pulse should be narrower than for other EEPROMs. In one example, the EEPROM charge time T1 should be 1 millisecond (ms), the steady state time T2 should be 5 ms, and the discharge time T3 should 160 microseconds. Such relatively short times permit a faster write time for the EEPROM.

Shorter discharge times become problematic because, as described above, the maximum discharge time is limited by the magnitude of the discharge current as well as the capacitance of the EEPROM's input capacitance. The embodiments described herein activate, when appropriate, an additional discharge current path to effectively increase the discharge current during the discharge time T3. By activating the additional discharge current path, the input capacitance of the EEPROM can be discharged faster to permit a faster falling edge 148 of the charge pulse 140 of VPP. The current magnitude of the additional discharge current path is a function of the difference between VFB and VREFI to ensure that VPP's proxy VFB (and thus VPP) is able to fall approximately as fast as VREFI. By implementing a discharge current path whose current magnitude is dependent on the difference between VFB and VREFI, the pulse generator described herein can be used in combination with different types of EEPROMs—EEPROMs that vary in terms of their input capacitance and discharge current. For example, the pulse generator described herein can function with EEPROMs whose input capacitance varies from 5 pico-Farads (pF) to 500 pF (which may be characteristic of EEPROMs having memory capacities from 64 bits to 8 kilobits) and whose discharge current varies from 2 micro-amperes to 40 micro-amperes.

Figure 2:
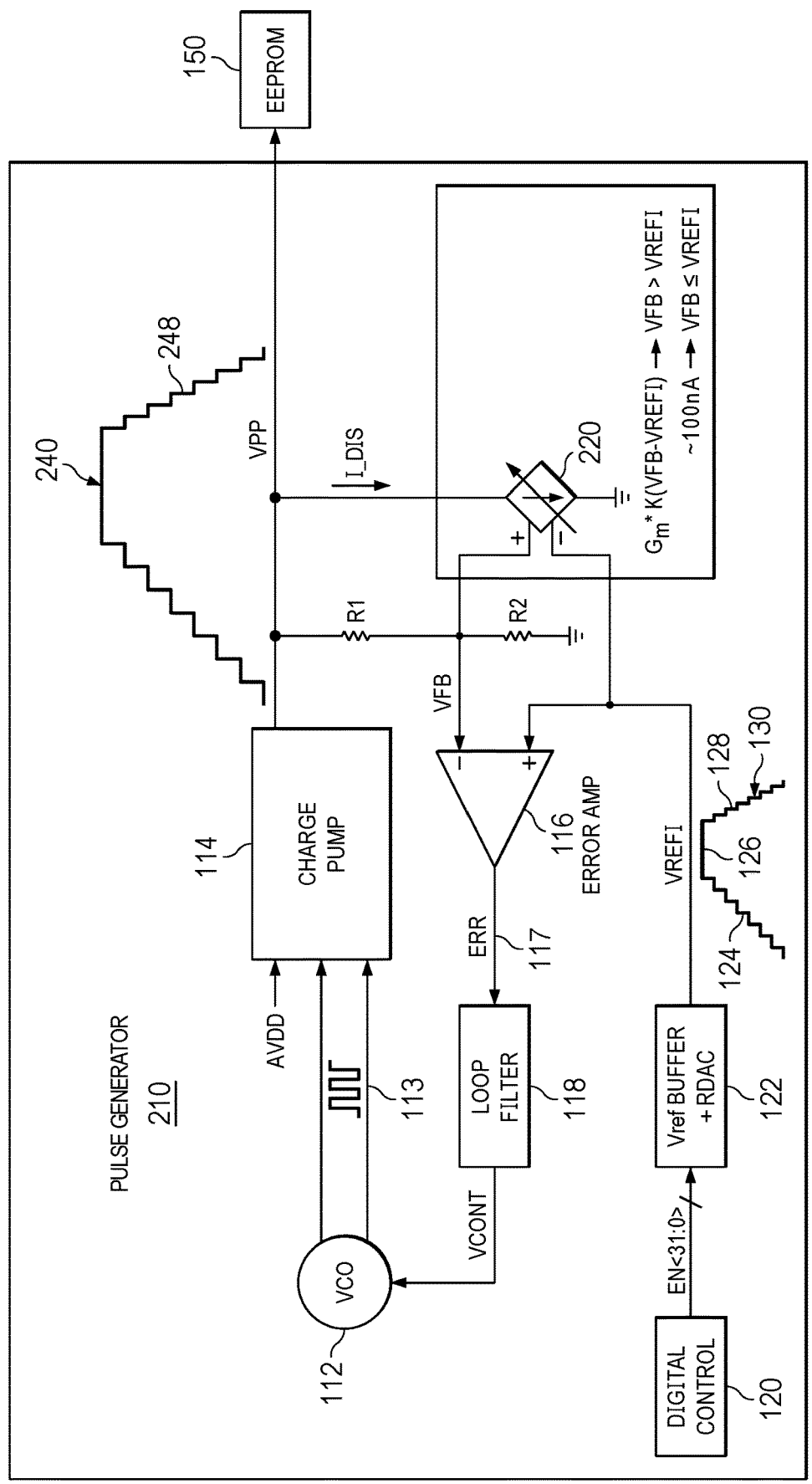
FIG. 2 is a block diagram of a pulse generator for providing a voltage pulse to a memory device to more accurately discharge the voltage pulse, in another example.

FIG. 2 is a block diagram of a pulse generator 210 coupled to EEPROM 150. Pulse generator 210 includes a VCO 112, charge pump 114, error amplifier 116, loop filter 118, digital control circuit 120, buffer and resistive digital-to-analog converter (RDAC) 122, resistors R1 and R2, and dependent current source circuit 220. The resistors R1 and R2 are coupled in series between VPP and ground and produce the feedback voltage VFB.

The negative input of the error amplifier 116 is coupled to resistor R2 and thus receives voltage VFB. The positive input of the error amplifier receives a reference voltage, VREFI, from the buffer and RDAC 122. The error amplifier 116 amplifies the difference between VFB and VREFI to produce the error signal, ERR. The error signal ERR is provided to an input of the loop filter 118. The loop filter 118 filters the error signal to produce a filtered output voltage, VCONT. VCONT is an input control voltage to the VCO 112. The digital control circuit 120 provides digital values to the buffer and RDAC 122 to produce the voltage pulse 130 of VREFI.

The control loop described above is operable to control VFB to increase and decrease at the same rate as VREFI to produce a similarly-shaped voltage pulse 240 for VPP. The dependent current source circuit 220 controls the magnitude of a discharge current, I_DIS based on the magnitude of VFB relative to VREFI. For a magnitude of VFB that is less than or equal to VFB, the dependent current source circuit 220 controls the magnitude of I_DIS to be an approximately constant value of, for example, 100 nanoamperes (nA). For a magnitude of VFB that is greater than VFB, the dependent current source circuit 220 controls the magnitude of I_DIS to be proportional to the difference between VFB and VREFI.

Figure 3:
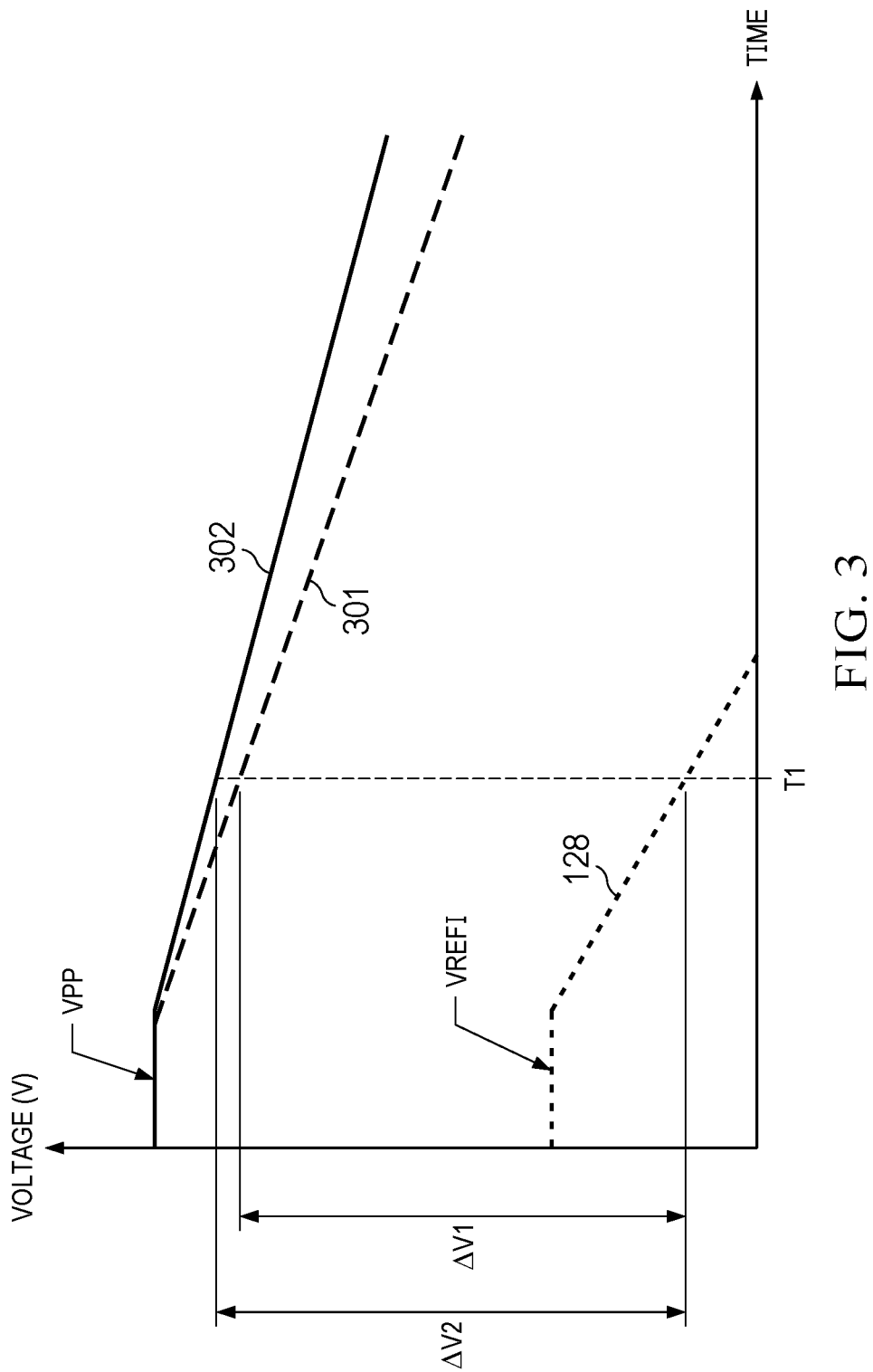
FIG. 3 are example waveforms illustrating the operation of the pulse generator of FIG. 2.

FIG. 3 shows example waveforms 301 and 302 of VPP relative to VREFI. The falling edge 128 of VREFI is shown. Waveform 301 is an example falling edge of VPP caused by the falling edge 128 of VREFI. Similarly, waveform 302 is another example falling edge of VPP. Neither VPP falling edge of waveforms 301 and 302 decreases as fast as the falling edge 128 of VREFI. Further, falling edge 302 has a slower slew rate than falling edge 301. For example, at a particular time point T1, the difference between the voltage of falling edge 302 and the voltage of VREFI is $\Delta V1$, which is smaller than the corresponding voltage difference $\Delta V1$ between the voltage of falling edge 302 and the voltage of VREFI. The dependent current source circuit 220 responds by producing a discharge current proportional to the voltage difference. Accordingly, the dependent current source circuit 220 will produce a larger discharge current for VPP example waveform 302 than for example waveform 301 to attempt to more closely match the slew rate of VPP to that of VREFI.

Figure 4:
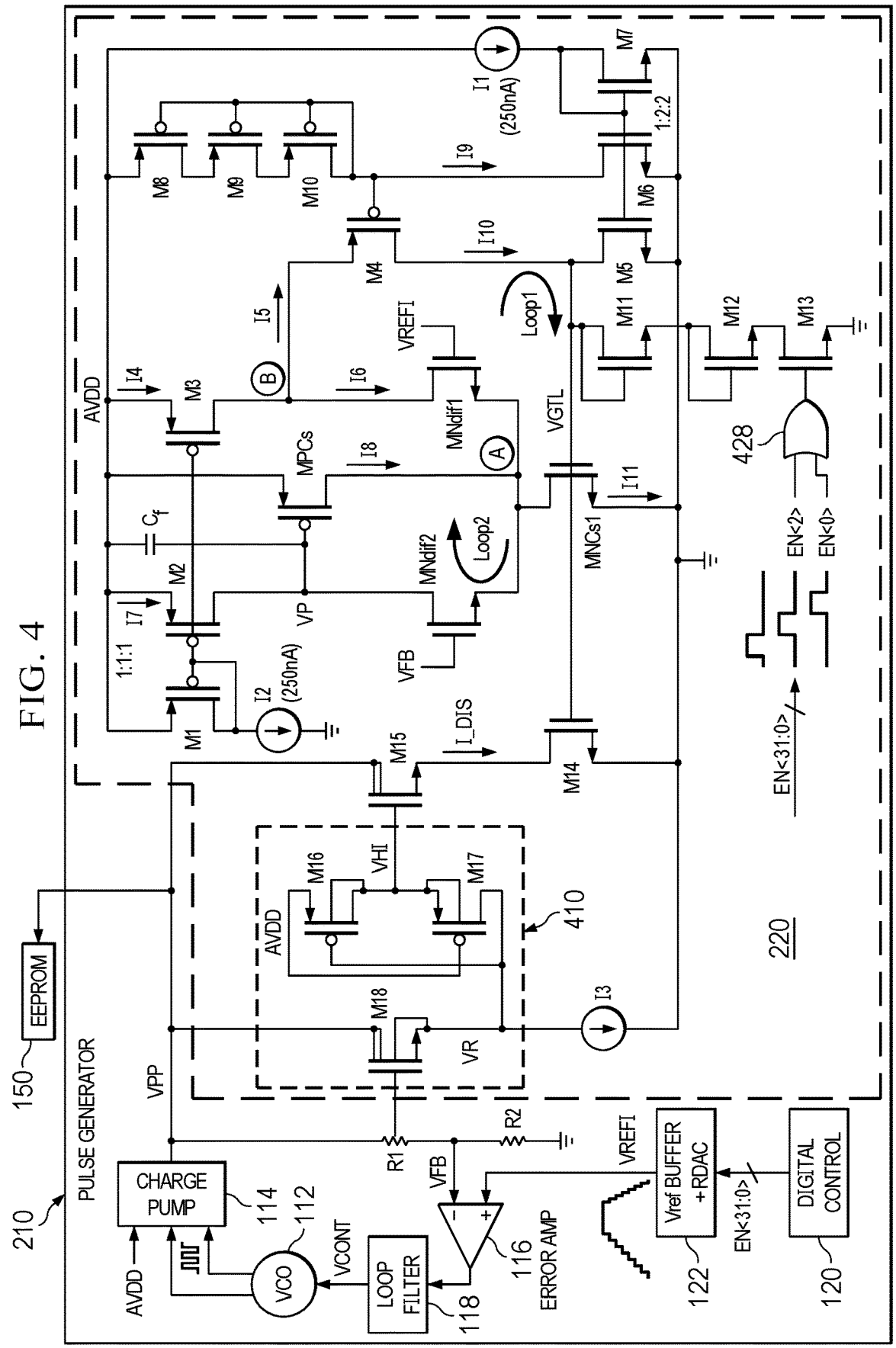
FIG. 4 is a schematic of the pulse generator of FIG. 2, in an example.
Figure 5:
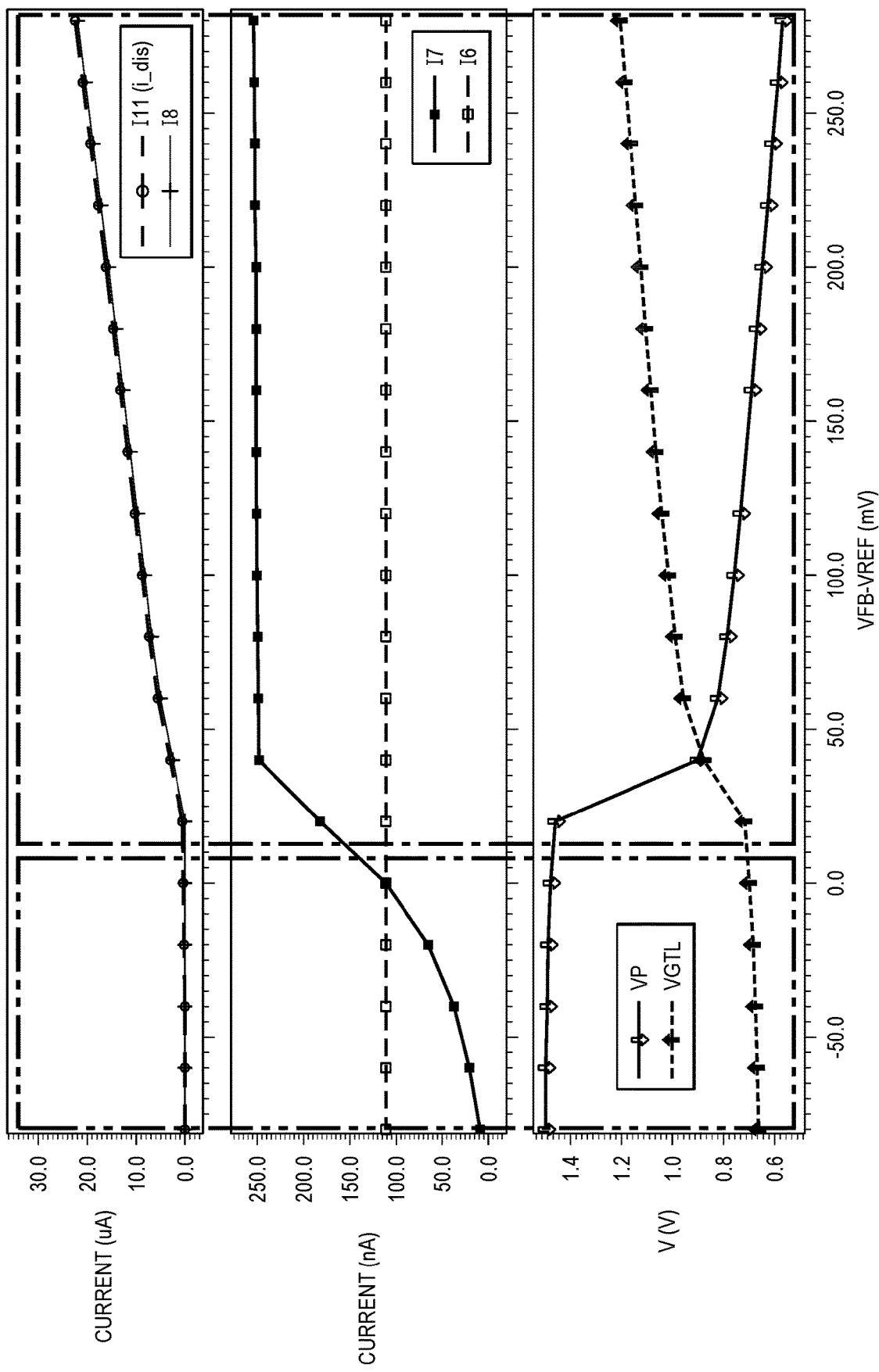
FIG. 5 are example waveforms illustrating the operation of the pulse generator of FIG. 3.
Figure 6:
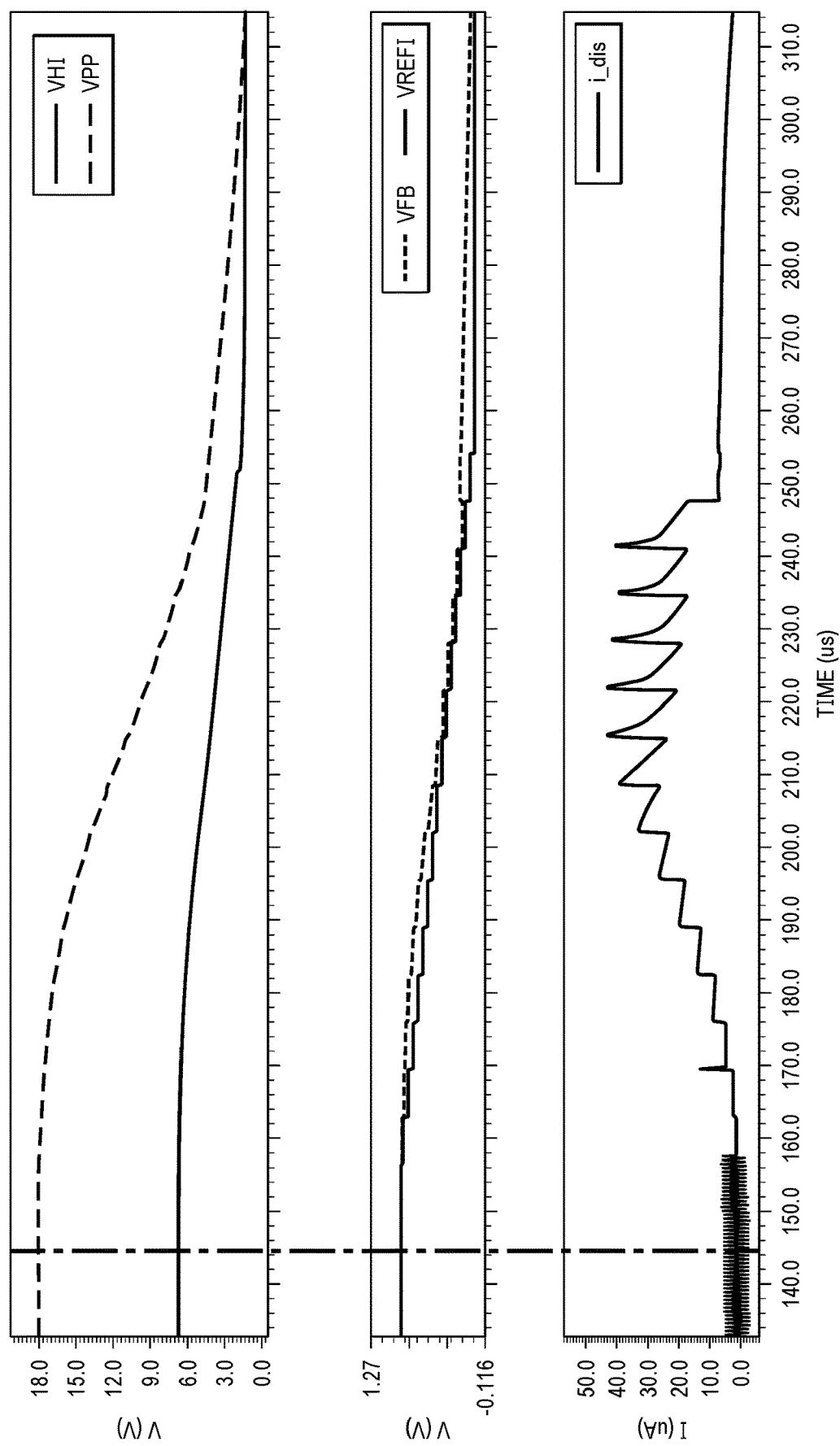
FIG. 6 are additional example waveforms illustrating the operation of the pulse generator of FIG. 3.

FIG. 4 is a schematic of pulse generator 210 in accordance with an example embodiment. The VCO, 112, charge pump 114, error amplifier 116, loop filter 118, digital control circuit 120, and buffer and RDAC 122 are shown as described above. FIG. 4 includes an example circuit implementation of the dependent current source circuit 220. In this example, the dependent current source circuit 220 includes transistors M1, M2, M3, MNdif1, MNdif2, MPCs, MNCs1, M4, M5, M6, M7, M8, M9, M10, M11, M12, M13, M14, M15, M16, M17, and M18, capacitor Cf, current sources I1, I2, and I3 (I1, I2, and I3 refer both to the circuits that produce the respective currents as well as the magnitude of the respective currents), and OR gate 428. The transistors in this embodiment are field effect transistors (FETs) but can be implemented as other types of transistors (e.g., bipolar junction transistors). Transistors M1-M4, MPCs, M8-M10, M16, and M17 are p-channel field effect transistors (PFETs). Transistors MNdif1, MNdif2, MNCs1, M5-M7, M11-M15, and M18 are n-channel field effect transistors (NFETs). Transistors M16-M18 are coupled together to form a bias voltage circuit 410 for properly biasing the gate of transistor M15, as described below.

Transistors MNdiff1 and MNdiff2 may be implemented as 5V natural NFETs. A natural NFET has a threshold voltage that is lower than a standard NFET. Accordingly, MNdiff1 and MNdiff2 may turn ON with a gate-to-source voltage (Vgs) as low as, for example, 100 mV.

Current source I2 is coupled between the drain of transistor M1 and ground. The sources of transistors M1, M2, M3, and M8 are coupled together and to AVDD. The gates of transistors M1-M3 are coupled together and to the drain of transistor M1. The drain of transistor M2 is coupled to the drain of transistor MNdif2 and to the gate of transistor MPCs. Capacitor Cf is coupled between the sources of transistors M1-M3 and the gate of transistor MPCs. The drains of transistors M3 and MNdif1 are coupled together and to the source of transistor M4 at node B. The gate of transistor MNdif1 receives VREFI, and the gate of transistor MNdif2 receives VFB. The sources of transistors MNdif1 and MNdif2 are coupled together and to the drain of transistor MNCs1 at node A.

The drains of transistors M4 and M5 are coupled together and to the gates of transistors MNCs1 and M14. The gates of transistors M5-M7 are coupled together as are the sources of transistors M5-M7. Transistors M5-M7 are configured as current mirrors with the current I1 forced into the drain of transistor M7 being mirrored as current I9 through transistor M6 and as current I10 through transistor M5. The size (ratio of channel width (W) to channel length (L)) of transistor M6 is approximately the same as that of transistor M7. The size of transistor M5 is approximately one-half the size of transistor M7. Accordingly, the magnitude of mirrored current I9 is approximately the same as the magnitude of I1, and the magnitude of mirrored current I10 is approximately one-half the magnitude of I1. The current magnitude in parentheses for I1 is an example of a suitable current for I1 and is shown as 250 nA. Accordingly, the current I9 also is approximately 250 nA and the current I10 is approximately 125 nA.

Transistors M1 and M3 are configured as a current mirror with the relative sizes of transistors M1 and M3 being approximately the same. Current I2 is forced through transistor M1, and thus current I4 through transistor is approximately the same magnitude as current I2. In this example, current I2 is 250 nA and, accordingly current I4 also is approximately 250 nA. Current I4 divides at node B between current I10 through transistor M4 and current I6 through transistor MNdif1. The magnitude of current I10 is dictated by the current mirror formed between transistors M5 and M7. In the example in which currents I4 and I1 are 250 nA and current I10 is 125 nA, current I6 will be 125 nA. The drain current through transistor MNdif1 remains approximately equal to 125 nA during operation of the circuit. However, the currents through transistors MNdif2 and MPCs will vary depending on the magnitude of VFB relative to VREFI.

Transistors M8-M10 are coupled in series between AVDD and the gate of transistor M4 and provide a bias voltage at the gate of transistor M4. The drains of transistors M11 and M12 are coupled to their gates. Accordingly, transistors M11 and M12 are configured as diode-connected transistors to provide a two-diode voltage drop between the gate of transistor MNCs1 (VGTL) and ground (through transistor M13). VREFI is provided to the gate of transistor MNCs1. As described above, VREFI ranges from approximately 0 V to approximately 1 V in one example. With VREFI being approximately equal to 0 V, it is possible that the Vgs of transistor MNdif1 will be below the threshold voltage of that transistor thereby turning OFF the transistor. If transistor MNdiff1 were to be OFF, VGTL will rise to approximately is AVDD, and the drain current through transistor MNdiff1 will be uncontrolled. The two-diode voltage drop between the gate of transistor MNCs1 and ground ensures that the drain current through transistor I6 is controlled. Transistor M13 functions as a switch controlled by the output of OR gate 428. The OR gate 428 logically ORs bits 0 and 2 of the EN digital signal. When either of those bits are logic 1 (which is indicative of a low level of VREFI), transistor M13 is turned ON thereby clamping the voltage VGTL on the gate of transistor MNCs1 to the two-diode voltage drop created by transistors M11 and M12. Otherwise, transistor M13 is OFF, and VGTL is controlled as described above. In this embodiment, VREFI is decreased in 16 steps instead of 32 steps, and thus OR gate 428 logically ORs bits 0 and 2 together to detect a low level for VREFI. In other embodiments, bits 0 and 1 can be OR'd together, OR gate 428 may be eliminated and bit 1 (or 0) may be coupled to the gate of transistor M13.

Transistors MNCS1 and M14 are configured as a current mirror (approximately a 1:1 mirror ratio). Accordingly, the current I11 through transistor MNCs1 is mirrored through transistor M14 as the discharge current I_DIS. During operation, the currents I7, I8, and I6 are summed together through transistor MNCS1 as current I11. Current I6 remains relatively constant (e.g., 125 nA) but currents I7 and I8 may vary from 0 A (OFF) to a higher current level (e.g., 250 nA).

During the falling edge 128 of the voltage pulse of VREFI, the control dependent current source circuit 220 attempts to control the magnitude of VFB to match VREFI. The magnitude of VFB will be in one of the three conditions, all three of which are described herein. First, VFB may be smaller than VREFI. Second, VFB may be equal to VREFI. Third, VFB may be larger than VREFI.

For the condition in which VFB is smaller than VREFI, the Vgs of transistor MNdiff2 will be smaller than the Vgs of transistor MNdiff1. Transistor MNdiff2 will be OFF because its Vgs is less than its threshold voltage. The voltage at node A (voltage referred to as "VA") will be set based on the Vgs of transistor MNdiff1 (one Vgs voltage drop below its gate voltage, VREFI. With transistor MNdiff2 OFF, voltage VP (voltage at the drain of transistor M2 and gate of transistor MPCs) will be forced upward to approximately AVDD. As VP increases, the drain-to-source voltage (Vds) of transistor M2 decreases, eventually turning OFF transistor M2. VP will be large enough to make the Vgs of transistor MPCs small enough that transistor MPCs will also be OFF.

With both transistors MNdiff2 and MPCs turned OFF, currents I7 and I8 will both be approximately 0 A, and current I11 will be equal to I6. Current I6 is a relatively constant current—I6 is, in part, a function of the Vgs of transistor MNdif1, and the Vgs of transistor MNdif1 remains relatively constant despite changes in VREFI relative to ground. VGTL is the voltage at the gate of transistor MNCs1 and is controlled by negative feedback of Loop1 (which includes transistor M4) to force the Vgs of transistor MNCs1 to be the particular voltage for which the drain current I11 through transistor MNCs1 approximately equals current I6. In this condition (VFB is less than VREFI), current I_DIS is approximately equal to relatively fixed current I6 (e.g., 125 nA).

For the condition in which VFB equals VREFI, the Vgs of transistors MNdif1 and MNdif2 are equal and, accordingly, current I7 equals current I6. Voltage VP will be approximately 100 mV to 200 mV below AVDD as transistor MNdif2 turns ON. VP will still be large enough that transistor M2 will turn ON into the linear region and functions as resistor than as a current source. VP also is low enough that the Vgs of transistor MPCs turns on transistor MPCs into weak subthreshold region, and current I8 begins to flow. Transistor M4 causes the voltage at node B (VB) and VGTL to settle to voltage such that I11 will approximately equal the sum of I6, I7, and I8. Transistor M4 along with M3 and M5 acts as a common gate amplifier. The voltage at node B (VB) is set by the current I5, the threshold voltage of transistor M4, and the gate voltage of transistor M4. Voltage Vb is a bias voltage which remains fairly constant (low impedance net) and is not dependent on VREFI voltage. The drain of M4 (which provides the voltage VGTL), on the other hand, is a high impedance net, and a negative feedback loop controls the magnitude of VGTL. This negative feedback is provided by Loop1.

For the condition in which VFB is not able to fall fast enough to match VREFI, the Vgs of transistor MNdif2 will be larger than the Vgs of transistor MNdif1. This difference in the transistors' Vgs means that I7 will be larger than I6. Transistor M2 will be in saturation and will thus act as a current source. Current I7 will be set by the current mirror formed by transistors M1 and M2. With a 1:1 current mirror ratio, for example, I7 will be equal to I2. In one example, I2 is 250 nA and thus I7 will also be approximately equal to 250 nA in this state. Transistors MNdif1 and MNCs1 along with transistor M4 form a control loop (Loop1) to adjust VA, VB and VGTL based on the difference between VREF and VFB and the voltage gain of Loop2 (which may be between 30 dB and 5 dB). The voltage at the gate of transistor MNCs1 is such that the increase in drain current through transistor MNCs1 will be a current proportional to $GM_{MNCs1}$*voltage gain of Loop2*(VREFI−VFB), where $GM_{MNCs1}$ is the transconductance of transistor MNCs1. Simultaneously, Loop2 (including transistors MNdif2 and MPCs) will adjust VP to cause current I8 to be equal to the difference between I11 and the sum of I6 and I7 (I8=I11−(I6+I7)). Accordingly, when VFB is greater than VREFI, I8 increases as the difference between VFB and VREFI increases.

The discharge current path for current I_DIS is from VPP through transistor M14 to ground. In one embodiment, the drain of transistor M14 could be coupled to VPP. In that embodiment, transistor M14 would need to be constructed to withstand the full VPP voltage drop between its drain and source. In one example, VPP may be 18V, so transistor M14 would need to be constructed safely withstand a Vds of at least 18V. Constructing such a transistor may require an additional high voltage mask during the fabrication process that may not otherwise be required for the other transistors in the circuit.

The embodiment of FIG. 4 avoids the need for the extra high voltage mask by including bias voltage circuit 410 which includes a cascode transistor M15 between VPP and the drain of transistor M14. The VPP voltage is divided between transistors M15 and M14. Accordingly, each transistor M14 and M15 has a Vds that is substantially below VPP, and thus neither transistor requires a high voltage mask for its fabrication.

In one example, transistor M14 is a 5V NFET meaning that the transistor M14 can safely withstand a Vds as high as 5V (plus a voltage margin). Further, cascode transistor M15 may be implemented as a 12V, drain-extended NFET. A drain-extended NFET is a transistor whose drain junction area is higher and differently doped than a conventional 5V NFET to withstand a higher voltage difference between its drain and source, between its drain and gate, and between its drain and bulk junction and is thus able to safely withstand a larger Vds (e.g., 12V plus a margin in this example).

Transistor M18 is coupled in series with current source I3 between VPP and ground. The voltage at the source of transistor M18 is labeled VR. Transistor M18 also is a source-follower in which its source voltage, VR, is one Vgs below its gate voltage. The gate voltage for transistor M18 is derived from the voltage divider formed by the series combination of resistors R1 and R2. The gate voltage for transistor M18 is not necessarily VFB. For example, the gate voltage for transistor M18 may be higher than VFB. The transistor M18 gate voltage and thus its source voltage, VR, are proportional to VPP—as VPP increases, VR increases, and as VPP decreases, VR decreases.

Cascode transistor M15 functions as a source-follower whose source voltage will be one Vgs below its gate voltage, VHI. VHI will either be approximately AVDD (when transistor M16 is ON) or VR (when transistor M17 is ON). The source voltage for transistor M16 is AVDD, and thus transistor M16 is ON when VR is at least a threshold voltage below AVDD. When transistor M16 is ON, transistor M17 is OFF. Transistor M17 turns ON responsive to VR being more than a threshold voltage above AVDD. When transistor M17 is ON, transistor M16 is OFF. Accordingly, VHI (gate voltage for cascode transistor M15) is the larger of AVDD or VR, which ensures that cascode transistor M15 receives an adequately large gate voltage to turn it ON without affecting the safe operating limit of transistor M14.

In some embodiments, the components of the pulse generator 110 may be fabricated on a common (same) semiconductor die (IC). Similarly, the components of the pulse generator 210 may be fabricated on a common IC. In some examples, the EEPROM 150 may be fabricated on a separate IC than the pulse generator's IC, and thus the pulse generator is an IC that can be coupled to the EEPROM. In other examples, the EEPROM may be fabricated on the same IC as the respective pulse generator 110, 210.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A pulse generator circuit, comprising:
   a charge pump having a charge pump output;
   a voltage divider coupled to the charge pump output, the voltage divider having a voltage divider output;
   an error amplifier having a first error amplifier input and a second error amplifier input, the first error amplifier input coupled to the voltage divider output; and
   a dependent current source circuit having a first input coupled to the charge pump output, a second input coupled to the voltage divider output, and a third input coupled to the second error amplifier input, the dependent current source circuit configured to cause a current to flow from the charge pump output that is proportional to a difference between a first voltage at the voltage divider output and a second voltage at the second error amplifier input, wherein:
      a first transistor having a first control input coupled to the second error amplifier input; and
      a second transistor having a second control input coupled to the voltage divider output; and
   wherein the dependent current source circuit includes:
      a first current mirror coupled to a first current source circuit, the first current mirror configured to provide a first current through the first transistor; and
      a second current mirror coupled to a second current source circuit, the second current mirror configured to provide a second current through the second transistor responsive to the first voltage being larger than the second voltage.

2. The pulse generator circuit of claim 1, wherein the dependent current source circuit comprises:
   a first current path configured to provide a first current; and
   a second current path configured to provide a second current that is a function of the difference between the first and second voltages.

3. The pulse generator circuit of claim 2, further comprising a current mirror coupled to a current source circuit, the current mirror coupled to the first current path.

4. The pulse generator circuit of claim 2, further comprising a current mirror comprising a third transistor coupled to a fourth transistor, the third transistor coupled to the first and second current paths, and the fourth transistor coupled between the charge pump output and a ground terminal, the fourth transistor configured to cause the current to flow from the charge pump output.

5. The pulse generator circuit of claim 4, further comprising a fifth transistor coupled between the charge pump output and the fourth transistor.

6. The pulse generator circuit of claim 1, wherein the error amplifier has an error amplifier output, the charge pump has a charge pump input, and the pulse generator circuit comprises:
   a filter having a filter input coupled to the error amplifier output, the filter having a filter output; and
   a voltage-controlled oscillator (VCO) having a VCO control input and having a VCO output coupled to the charge pump input.

7. An integrated circuit (IC), comprising:
   a voltage circuit having a voltage circuit output;
   a voltage divider coupled to the voltage circuit output, the voltage divider having a voltage divider output;
   an amplifier having a first amplifier input and a second amplifier input, the first amplifier input coupled to the voltage divider output; and
   a current source circuit having a first input coupled to the voltage circuit output, a second input coupled to the voltage divider output, and a third input coupled to the second amplifier input, the current source circuit configured to cause a current to flow from the voltage circuit output that is proportional to a difference between a first voltage at the voltage divider output and a second voltage at the second amplifier input, wherein:
  a first transistor having a first control input coupled to the second amplifier input; and
  a second transistor having a second control input coupled to the voltage divider output; and
wherein the current source circuit includes:
  a first current mirror coupled to a first current source circuit, the first current mirror configured to provide a first current through the first transistor; and
  a second current mirror coupled to a second current source circuit, the second current mirror configured to provide a second current through the second transistor responsive to the first voltage being larger than the second voltage.

8. The IC of claim 7, further comprising a third transistor having a third control input, the third control input coupled to the second current mirror.

9. The IC of claim 7, further comprising a current mirror comprising a third transistor coupled to a fourth transistor, the third transistor coupled to the first and second transistors, and the fourth transistor coupled between the voltage circuit output and a ground terminal, the fourth transistor configured to cause the current to flow from the voltage circuit output.

10. The IC of claim 9, further comprising a fifth transistor coupled between the voltage circuit output and the fourth transistor.

11. The IC of claim 7, further comprising a memory coupled to the voltage circuit output.

12. A pulse generator, comprising:
  a charge pump having a charge pump output and a charge pump input;
  a voltage divider coupled to the charge pump output, the voltage divider having a voltage divider output;
  an error amplifier having a first error amplifier input, a second error amplifier input, an error amplifier output, wherein the first error amplifier input is coupled to the voltage divider output;
  a first transistor having a first control input and first and second current terminals, wherein the first control input is coupled to the second error amplifier input;
  a second transistor having a second control input and third and fourth current terminals, the second and fourth current terminals coupled together, wherein the second control input is coupled to the voltage divider output;
  a third transistor having a third control input and fifth and sixth current terminals, the fifth current terminal coupled to the second and fourth current terminals;
  a fourth transistor having a fourth control input and seventh and eighth current terminals, the fourth control input coupled to the third control input, and the eight and sixth current terminals coupled together, and the fourth transistor coupled between the charge pump output and a ground terminal;
  a filter having a filter input coupled to the error amplifier output, the filter having a filter output; and
  a voltage-controlled oscillator (VCO) having a VCO control input and having a VCO output coupled to the charge pump input.

13. The pulse generator of claim 12, further comprising a fifth transistor coupled between the charge pump output and the seventh current terminal.

14. The pulse generator of claim 13, wherein the fifth transistor has a fifth control input, and the pulse generator comprises a bias voltage circuit coupled to the charge pump output, the bias voltage circuit having a bias voltage output coupled to the fifth control input.

15. The pulse generator of claim 14, wherein the bias voltage circuit comprises:
  a sixth transistor having a ninth current terminal; and
  a seventh transistor having a tenth current terminal, the ninth and tenth current terminals coupled to the fifth control input.

16. The pulse generator of claim 12, further comprising a fifth transistor having a fifth control input and ninth and tenth current terminals, the fifth control input coupled to the first current terminal, and the tenth current terminal coupled to the second and fourth current terminals.

* * * * *